(12) United States Patent
Yoshinaga (10) Patent No.: US 9,078,324 B2
(45) Date of Patent: Jul. 7, 2015

(54) LED DRIVING DEVICE, LED LIGHTING APPARATUS, AND ERROR AMPLIFICATION CIRCUIT

(71) Applicant: Sanken Electric Co., Ltd., Niiza-shi, Saitama (JP)

(72) Inventor: Mitsutomo Yoshinaga, Niiza (JP)

(73) Assignee: Sanken Electric Co., Ltd., Niiza-shi (JP)

( * ) Notice: Subject to any disclaimer, the term of this patent is extended or adjusted under 35 U.S.C. 154(b) by 0 days.

(21) Appl. No.: 14/305,271

(22) Filed: Jun. 16, 2014

(65) Prior Publication Data
US 2014/0375227 A1 Dec. 25, 2014

(30) Foreign Application Priority Data
Jun. 24, 2013 (JP) .................. 2013-131370

(51) Int. Cl.
*H05B 37/02* (2006.01)
*H05B 33/08* (2006.01)
*H03G 3/00* (2006.01)

(52) U.S. Cl.
CPC ........ *H05B 33/0842* (2013.01); *H05B 33/0884* (2013.01); *H03G 3/00* (2013.01)

(58) Field of Classification Search
USPC ...... 315/291, 307, 312, 200 R, 212, 213, 214
See application file for complete search history.

(56) References Cited

U.S. PATENT DOCUMENTS

2004/0251854 A1* 12/2004 Matsuda et al. ............... 315/291
2009/0278521 A1* 11/2009 Omi et al. ...................... 323/288

FOREIGN PATENT DOCUMENTS

JP      2010282757 A    12/2010

* cited by examiner

*Primary Examiner* — Minh D A
(74) *Attorney, Agent, or Firm* — Marvin A. Motsenbocker; Mots Law, PLLC (57) ABSTRACT

An error amplification circuit amplifies an error voltage between a reference voltage and an output voltage of the LED current sensor. A control circuit controls the DC output power so that the DC output power becomes a predetermined value, by performing on-off control on a switching element based on the output voltage of the error amplification circuit. The error amplification circuit includes an error amplifier, a phase compensation circuit connected between an inverting input terminal and an output terminal of the error amplifier and having a serial circuit of a phase compensation capacitor and a phase compensation resistor, a gain adjustment resistor serially connected at one end to the serial circuit and connected at the other end to the LED current sensor, and a short circuit configured to make the inverting input terminal of the error amplifier grounded for a predetermined period of time after activation.

4 Claims, 8 Drawing Sheets

LED DRIVING DEVICE, LED LIGHTING APPARATUS, AND ERROR AMPLIFICATION CIRCUIT

TECHNICAL FIELD

The present invention relates to an LED driving device, an LED lighting apparatus, and an error amplification circuit.

BACKGROUND ART

Preferably, lighting equipment is to light up as soon as it is turned on. An LED lighting apparatus using LED elements should desirably light up instantly, as well. The LED elements are desired to start lighting up at most one second after the activation of the LED lighting apparatus. Accordingly, also in an LED lighting apparatus incorporating a converter, a control IC is required to start control of LED current within about one second after the start of activation.

Figure 1:
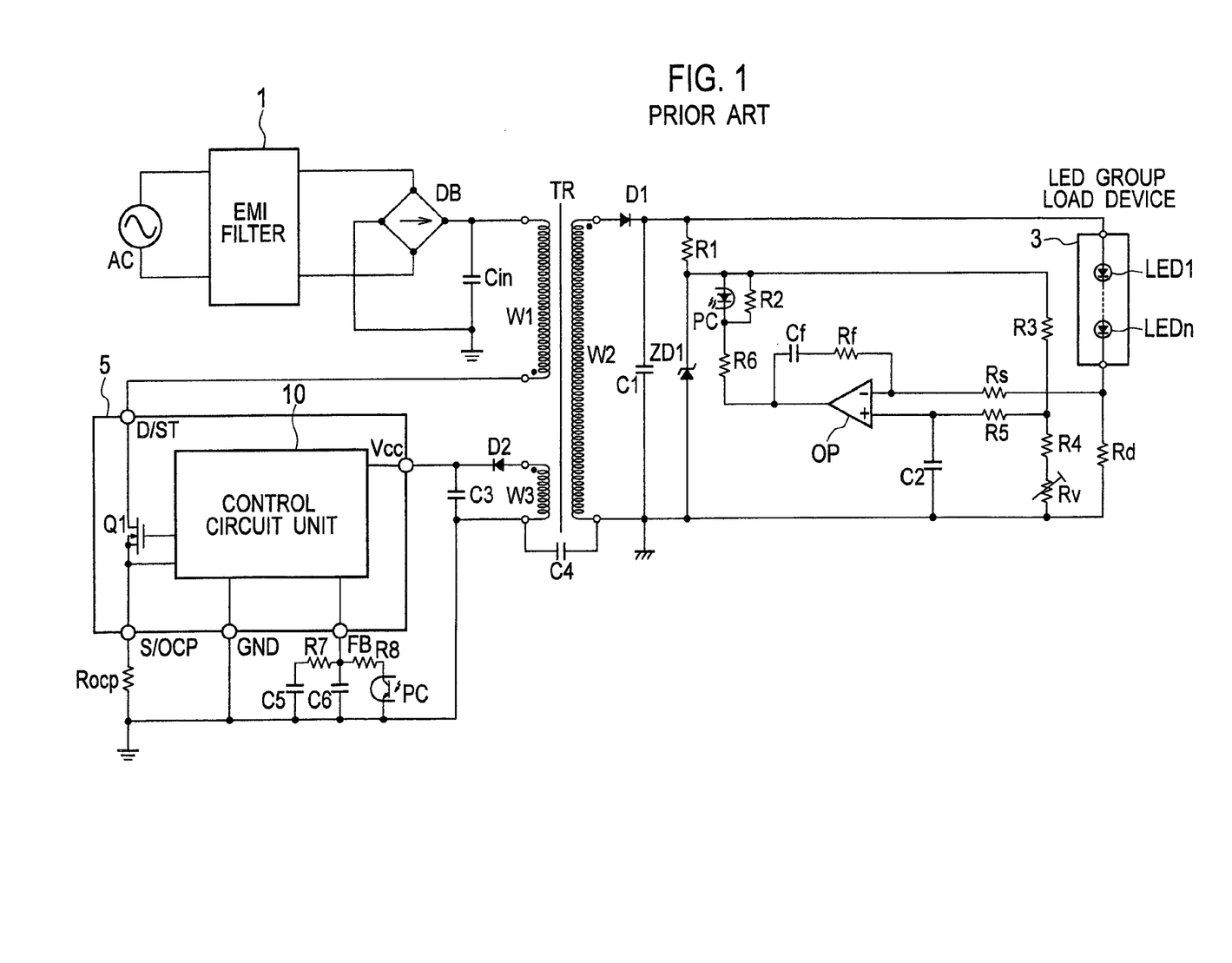
FIG. 1 is a diagram showing an example of a circuit configuration of a conventional LED driving device.

FIG. 1 is a diagram showing an example of a circuit configuration of an LED driving device described in Japanese Patent Application Publication No. 2010-282757. The conventional LED driving device shown in FIG. 1 includes an AC power supply AC, an EMI filter 1, a capacitor Cin, a rectifying circuit DB, a transformer TR, a MOSFET (switching element) Qin, a control circuit unit 10, a rectifying-smoothing circuit constituted by a diode D1 and a capacitor C1, a capacitor C3, and an error amplification circuit containing an error amplifier OP. The LED driving device and an LED group load device 3 (LED1, . . . LEDn) constitute an LED lighting apparatus. A MOSFET Q1 and the control circuit unit 10 constitute a control IC 5.

The rectifying circuit DB is a known diode bridge circuit, is connected to the AC power supply AC, rectifies AC input power into pulsating current power in one direction, and outputs the rectified power to the transformer TR. The transformer TR has a primary winding W1, a secondary winding W2, and a tertiary winding W3. The primary winding W1 is connected at one end to the rectifying circuit DB and at the other end to a drain of the MOSFET Q1. The rectifying-smoothing circuit constituted by the diode D1 and the capacitor C1 is connected between both ends of the secondary winding W2. An auxiliary power supply which is constituted by a diode D2 and the capacitor C3 and which provides power supply to the control circuit unit 10 after activation is connected between both ends of the tertiary winding W3.

The MOSFET Q1 is grounded at its source via a resistor Rocp, and connected at its gate to the control circuit unit 10.

A serial circuit of the LED group load device 3 and a current sensing resistor Rd is connected to both ends of the capacitor C1, the LED group load device 3 including n pieces of serially-connected LED elements (LED1, . . . LEDn). An inverting input terminal of the error amplifier OP is connected to the current sensing resistor Rd and the LED element LEDn via a gain adjustment resistor Rs. A serial circuit of a phase compensation capacitor Cf and a phase compensation resistor Rf is connected between the inverting input terminal and an output terminal of the error amplifier OP. The phase compensation capacitor Cf and the phase compensation resistor Rf constitute a phase compensation circuit.

A serial circuit of a resistor R1 and a zener diode ZD1 is connected to both ends of the capacitor C1. A serial circuit of a resistor R3, a resistor R4, and a variable resistor Rv is connected between both ends of the zener diode ZD1. A connection point between the resistor R3 and the resistor R4 is connected to a non-inverting input terminal of the error amplifier OP via a resistor R5. A capacitor C2 is connected between the non-inverting input terminal of the error amplifier OP and the ground.

The output terminal of the error amplifier OP is connected to a connection point between the resistor R1 and the zener diode ZD1 via a serial circuit of a resistor R6 and a resistor R2. The resistor R2 is parallel-connected to a photodiode of a photo coupler PC.

One end of a resistor R7, one end of a resistor R8, and one end of a capacitor C6 are connected to an FB terminal of the control IC 5. The other end of the resistor R7 is grounded via a capacitor C5, and the other end of the capacitor C6 is grounded. The other end of the resistor R8 is connected to a collector of a phototransistor of a photo coupler PC, and an emitter of the phototransistor is grounded.

In the LED lighting apparatus thus configured, the control circuit unit 10 turns on and off the MOSFET (switching element) Q1 to thereby transform the rectified voltage from the rectifying circuit DB into a high-frequency voltage and generate a high-frequency voltage at the secondary winding W2 of the transformer TR. This high-frequency voltage is rectified and smoothed by the diode D1 and the capacitor C1, and a DC voltage thus obtained is applied to the LED group load device 3.

A current thereby flows through the LED group load device 3, lighting up the LED elements LED1 to LEDn. In this event, the error amplifier OP amplifies an error voltage between a voltage at the inverting input terminal and a voltage at the non-inverting input terminal. A current according to the magnitude of this amplified error voltage flows through the photodiode of the photo coupler PC, and the amount of light emitted by the photodiode changes according to the current flowing therethrough. Thus, a current according to the amount of light emitted by the photodiode flows through the phototransistor of the photo coupler PC connected to the FB terminal. In other words, a voltage according to a current detected by the current sensing resistor Rd is fed back to the control circuit unit 10, and the control circuit unit 10 controls the duty cycle for turning on and off the MOSFET Q1 so that the voltage according to the current detected by the current sensing resistor Rd can become a predetermined voltage. Further, the brightness level can be controlled by changing the variable resistor Rv.

In the LED lighting apparatus shown in FIG. 1, even when the AC power supply AC is turned off, the error amplifier OP is not powered off instantly, because the amount of electric charge in the capacitor C1 has a large amount of electric charge and therefore requires a certain time to complete discharging. To solve this problem, an LED lighting apparatus shown in FIG. 2 is used.

Figure 2:
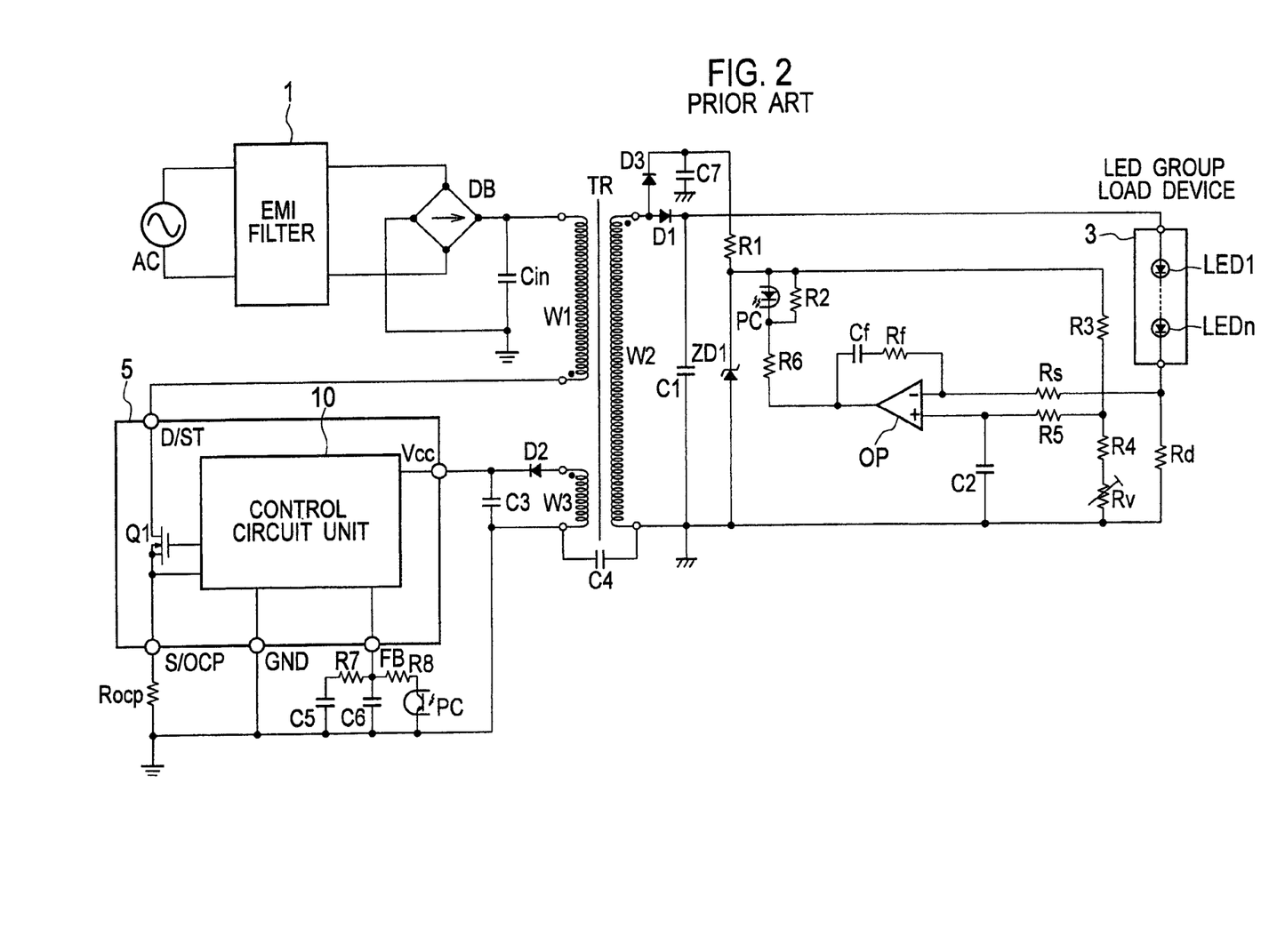
FIG. 2 is a diagram showing another example of a circuit configuration of a conventional LED driving device.

The LED lighting apparatus shown in FIG. 2 is provided with a diode D3 and a capacitor C7 in addition to the configuration of the LED lighting apparatus shown in FIG. 1. Moreover, one end of the resistor R1 is connected to a cathode of the diode D3 and one end of the capacitor C7, instead of the connection point between the diode D1 and the capacitor C1. An anode of the diode D3 is connected to an anode of the diode D1 and one end of the secondary winding W2, and the other end of the capacitor C7 is grounded. When the AC power supply AC is turned on, a voltage generated at the secondary winding W2 is rectified and smoothed by the diode D3 and the capacitor C7, and a DC voltage thus obtained is applied to the error amplifier OP. When the AC power supply AC is turned off, the error amplifier OP is powered off instantly, because the capacitor C7 has a small amount of electric charge and therefore completes discharging instantly.

Thus, the error amplifier OP is always reset at the power-off, and thereby can avoid unstable operation when the AC power supply AC is turned on again.

As described earlier, in the LED lighting apparatus, the control IC is also required to start control of LED current within about one second after the start of activation.

However, the LED lighting apparatus including a single-stage PFC converter with a power factor correction function in Japanese Patent Application Publication No. 2010-282757 has poor power-supply activation performance since the apparatus is provided with the phase compensation circuit which slows down the response speed of a feedback circuit for feeding the secondary-side output of the transformer TR back to the control circuit unit 10. Moreover, in a case where the apparatus is provided with a brightness control function to continuously change the brightness level, the start of lighting is further delayed particularly when the brightness control level is set to the minimum level.

The present invention provides an LED driving device, an LED lighting apparatus, and an error amplification circuit capable of shortening a time required to start LED-lighting.

SUMMARY OF INVENTION

An LED driving device of the present invention is an LED driving device that transforms AC input power into desired DC output power and supplies the DC output power to an LED load, the LED driving device comprising: a switching element configured to be subjected to on-off control; an LED current sensor serially connected to the LED load and configured to detect a current flowing through the LED load; an error amplification circuit configured to amplify an error voltage between a reference voltage and a voltage which is based on the current detected by the LED current sensor; and a control circuit configured to control the DC output power so that the DC output power becomes a predetermined value, by performing the on-off control on the switching element based on the error voltage amplified by the error amplification circuit. The error amplification circuit includes an error amplifier, a phase compensation circuit being connected between an inverting input terminal and an output terminal of the error amplifier and having a serial circuit of a phase compensation capacitor and a phase compensation resistor, a gain adjustment resistor serially connected at one end to the serial circuit and connected at the other end to the LED current sensor, and a short circuit configured to make the inverting input terminal of the error amplifier grounded for a predetermined period of time after activation.

In addition, an error amplification circuit of the present invention comprises: an error amplifier; a phase compensation circuit being connected between an inverting input terminal and an output terminal of the error amplifier and having a serial circuit of a phase compensation capacitor and a phase compensation resistor; a gain adjustment resistor serially connected to the serial circuit; and a short circuit configured to make the inverting input terminal of the error amplifier grounded for a predetermined period of time after activation.

BRIEF DESCRIPTION OF DRAWINGS

FIG. 12 is a diagram showing an ON duration of the MOSFET Q3 when the MOSFET Q2 is turned on after the MOSFET Q3 is turned on.

DESCRIPTION OF EMBODIMENTS

Next, with reference to the drawings, a description is given of an LED driving device, an LED lighting apparatus, and an error amplification circuit according to embodiments of the present invention.

The LED driving device and the LED lighting apparatus according to the embodiments are characterized in that the response of a feedback circuit which feeds a secondary-side output of a transformer back to a control circuit on a primary side is externally controlled only upon power supply activation, to thereby shorten a time required to start LED-lighting.

First Embodiment

Figure 3:
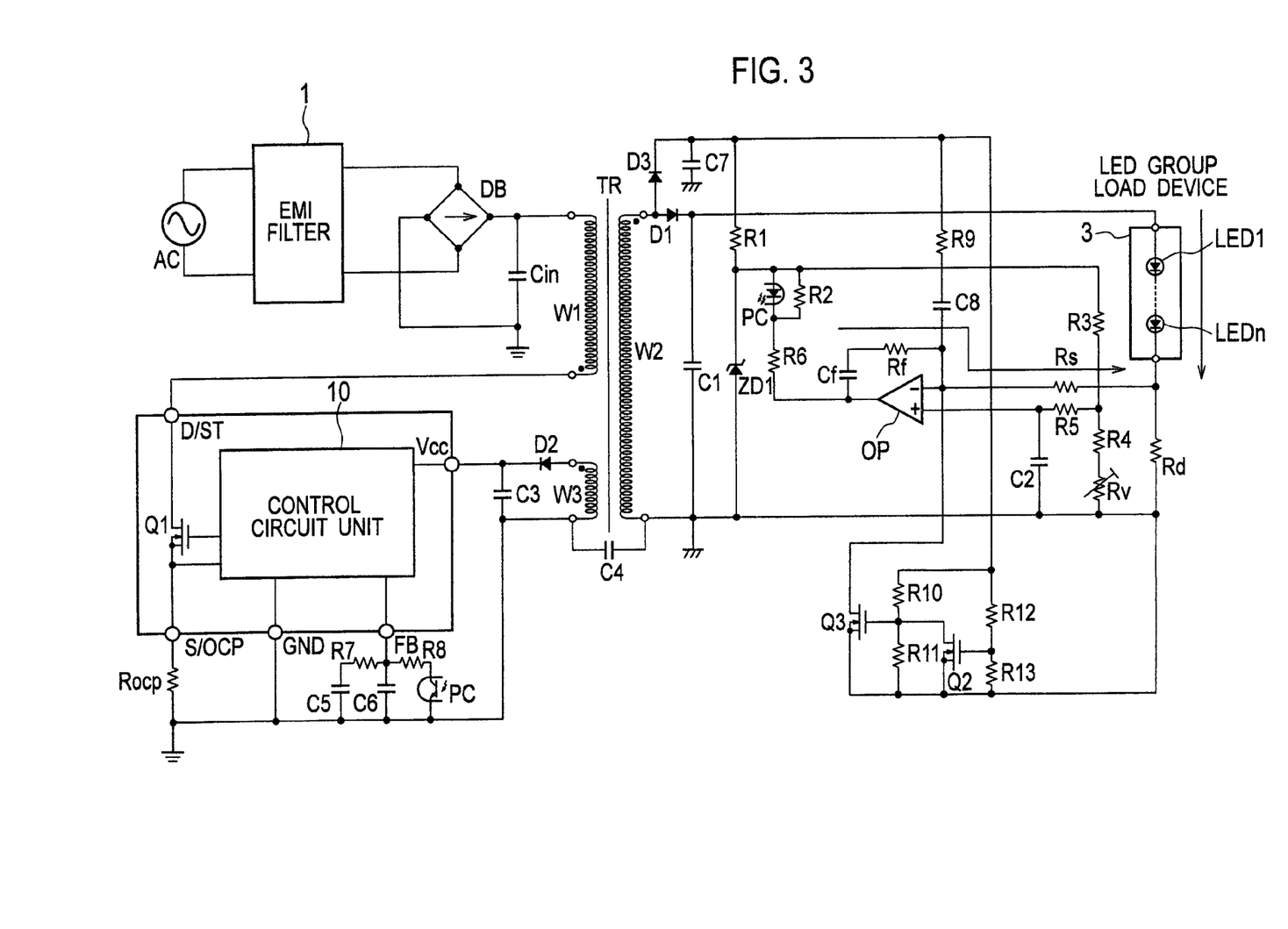
FIG. 3 is a circuit diagram showing a configuration of an LED driving device according to a first embodiment of the present invention.

FIG. 3 is a circuit diagram showing the configuration of a LED driving device according to a first embodiment of the present invention. The LED driving device shown in FIG. 3 is characterized in having an N-type MOSFET Q3, an N-type MOSFET Q2, and resistors R10 to R13, in addition to the elements of the LED driving device shown in FIG. 2. The MOSFET Q3, the MOSFET Q2, and the resistors R10 to R13 constitute a short circuit of the present invention. This short circuit makes the inverting input terminal of the error amplifier OP grounded for a predetermined period of time after activation of the LED driving device.

A resistor R9 is connected at one end to one end of the capacitor C7, to the cathode of the diode D3, and to one end of the resistor R1, and is connected at the other end to one end of a capacitor C8. The other end of the capacitor C8 is connected to the inverting input terminal of the error amplifier OP, one end of the phase compensation resistor Rf, one end of the gain adjustment resistor Rs, and a drain of the MOSFET Q3.

One end of the resistor R10 and one end of the resistor R12 are connected to one end of the resistor R9, one end of the capacitor C7, the cathode of the diode D3, and one end of the resistor R1. The other end of the resistor R10 is connected to one end of the resistor R11, a gate of the MOSFET Q3, and a drain of the MOSFET Q2. The other end of the resistor R12 is connected to one end of the resistor R13 and a gate of the MOSFET Q2. The other end of the resistor R11 is connected to a source of the MOSFET Q3, a source of the MOSFET Q2, and the other end of the resistor R13.

To facilitate an understanding of the embodiment of the present application, it is assumed herein that resistance values of the resistor R10, the resistor R11, and the resistor R13 are all equal to one another, and that a resistance value of the resistor R12 is $\alpha$ times that of the resistor R10 ($\alpha > 1$).

Figure 4:
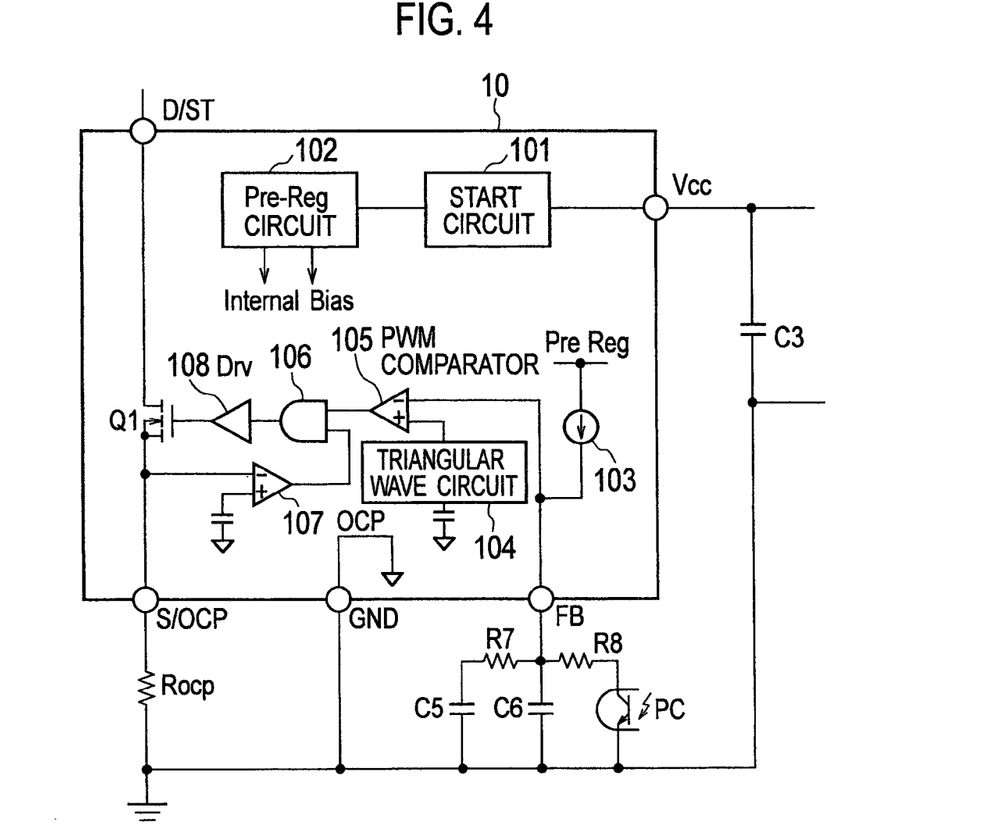
FIG. 4 is a circuit diagram of a control circuit unit in the LED driving device according to the first embodiment of the present invention.

FIG. 4 is a circuit diagram of the control circuit unit of the LED driving device according to the first embodiment of the present invention. The control circuit unit 10 includes a start circuit 101, a power supply circuit (Pre Reg circuit) 102, a current source 103, a triangular wave circuit 104, a PWM comparator 105, an AND circuit 106, an overvoltage protection comparator (OPC comparator) 107, and a driver 108.

The start circuit 101 starts the control circuit with a voltage from the capacitor C3. The power supply circuit (Pre Reg circuit) 102 provides power supply to each element of the control circuit unit 10 in response to a start signal from the start circuit 101. The current source 103 passes a current to the resistor R8 and the phototransistor of the photo coupler PC via the FB terminal.

The PWM comparator 105 generates a pulse signal by comparing a triangular wave signal from the triangular wave circuit 104 and a voltage at the capacitor C6 from the FB terminal (feedback voltage), and outputs the pulse signal to the AND circuit 106. The pulse signal is an ON-width signal according to the feedback voltage.

The AND circuit 106 outputs the pulse signal from the PWM comparator 105 to the gate of the MOSFET Q1 via the driver 108. Thus, the MOSFET Q1 is turned on and off based on the ON-width signal which is in accordance with the feedback voltage, and thereby a switching current flows, the switching current being in proportional to a sinusoidal voltage which has been rectified to AC. By this operation, power factor correction operation is performed.

The overvoltage protection comparator (OPC comparator) 107 performs overvoltage protection on the MOSFET Q1 by comparing a voltage at the resistor Rocp with a reference voltage, and outputting L level to the AND circuit 106 to turn the MOSFET Q1 off when the voltage at the resistor Rocp exceeds the reference voltage.

Note that the LED driving device according to the first embodiment is characterized in that the response frequency of the control circuit unit 10 is lower than the frequency of the AC power supply AC.

Figure 5:
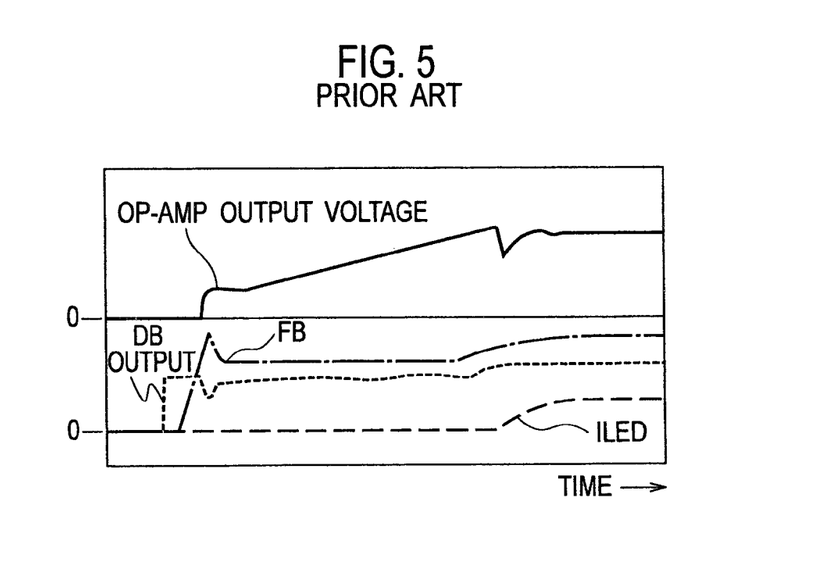
FIG. 5 is a diagram showing an operation waveform of each element of the conventional LED driving device when the brightness control level is 5%.

FIG. 5 is a diagram showing an operation waveform of each element of a conventional LED driving device when the brightness control level is 5%. FIG. 5 shows an output voltage of the error amplifier OP (OP-AMP OUTPUT VOLTAGE), a voltage at the FB terminal, an LED current ILED flowing through the LED elements LED1 to LEDn, and an output of the DB. When, for example, the reference voltage for the non-inverting input terminal of the error amplifier OP is 300 mV and the brightness control level is 100%, in order to reduce the brightness control level to 5%, the value of the variable resistor Rv is reduced, and the reference voltage for the non-inverting input terminal of the error amplifier OP is reduced to 15 mV. As can be seen in FIG. 5, the LED current ILED flows after a considerable amount of time passes since the DB output is applied.

Further, since the LED current ILED flows less than one second, the inverting input terminal of the error amplifier OP is at 0 V during that period, and the output terminal of the error amplifier OP should be in an H level state. However, actually, as shown in FIG. 5, the output voltage of the error amplifier OP gradually increases.

Figure 6:
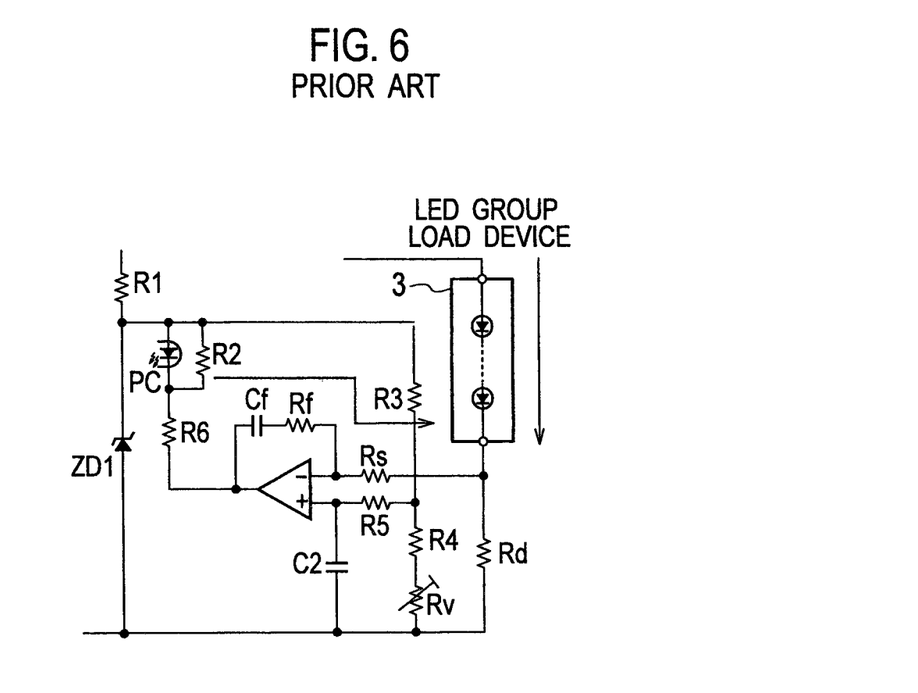
FIG. 6 is a diagram showing how a voltage is generated at an inverting input terminal of an error amplifier via a phase compensation circuit upon activation of the conventional LED driving device.

A reason for this is described using FIG. 6. First, since the LED current ILED flows less than one second, the inverting input terminal of the error amplifier OP is at 0 V during that period, and the output terminal of the error amplifier OP is in an H level state. Then, a current flows in the following route: the phase compensation capacitor Cf→the phase compensation resistor Rf→the gain adjustment resistor Rs→the current sensing resistor Rd. Hence, a voltage is generated at the gain adjustment resistor Rs and the current sensing resistor Rd, and this voltage is applied to the inverting input terminal of the error amplifier OP. The brightness control level is 5%, and the reference voltage is as small as 15 mV. Thus, when the voltage at the inverting input terminal of the error amplifier OP reaches the reference voltage 15 mV, the output terminal of the error amplifier OP becomes L level. For this reason, even though the LED current ILED is 0, a seeming feedback voltage is present, elongating a period until the LED elements start lighting up.

Figure 7:
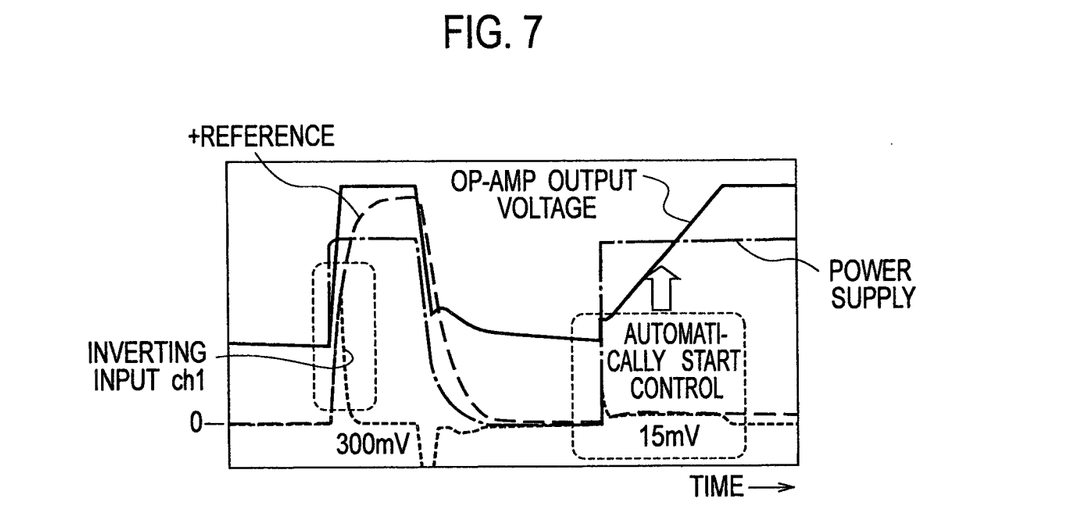
FIG. 7 is a diagram showing an operation waveform of each element when the error amplifier shown in FIG. 6 is operated alone by an external power supply and a reference voltage is changed from 300 mV to 15 mV.

Next, using FIG. 7, a description is given of an operation waveform of each element when the error amplifier OP in FIG. 6 is operated alone by an external power supply, and the reference voltage is changed from 300 mV to 15 mV. The reference voltage (denoted as ch4 in FIG. 7) is 300 mV on the left hand and is 15 mV on the right hand. The reference voltage ch4 increases gradually due to a soft start circuit formed by the capacitor C2 and the variable resistor Rv, and meanwhile, a voltage at the inverting input terminal of the error amplifier OP (denoted as ch1 in FIG. 7) also increases proportionally, and then, these voltages separate from each other. The output voltage of the error amplifier OP is being controlled while the reference voltage (ch4) and the voltage ch1 at the inverting input terminal coincide with each other.

Figure 8:
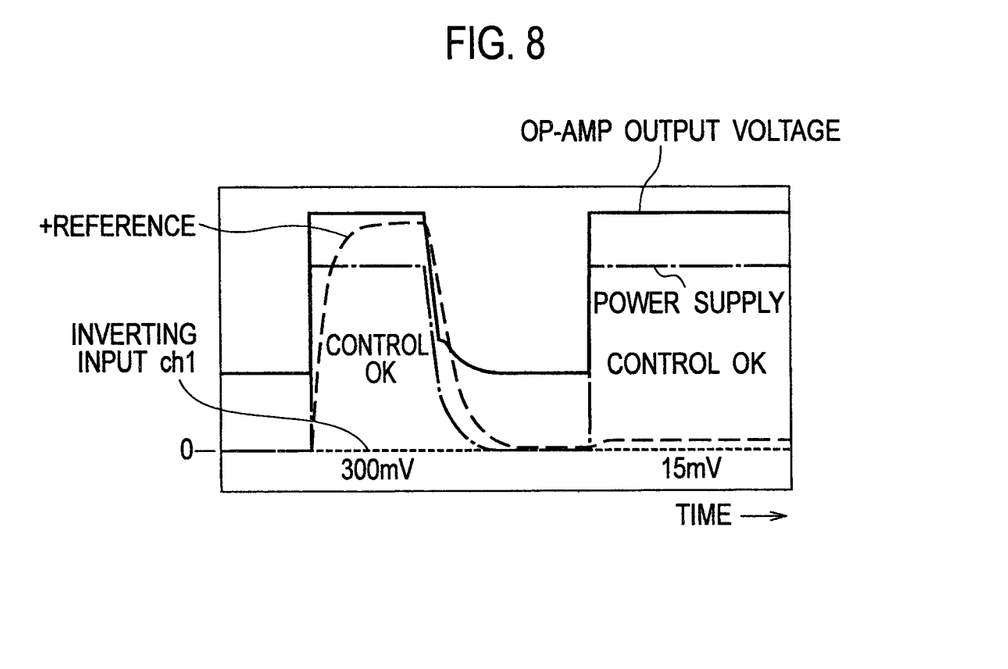
FIG. 8 is a diagram showing an operation waveform of each element when the error amplifier shown in FIG. 6 from which the phase compensation circuit is omitted is operated alone by an external power supply and the reference voltage is changed from 300 mV to 15 mV.

However, when the reference voltage ch4 is very small (15 mV for a brightness control level of 5% relative to 300 mV), the FB signal becomes strong, so that the error amplifier OP automatically starts its control. Note that, as shown in FIG. 8, when the phase compensation circuit is omitted from the error amplification circuit, the inverting-input-terminal voltage does not increase, and the output voltage of the error amplifier OP rapidly rises.

As described above, when a current flowing into the phase compensation capacitor Cf restricted by the phase compensation resistor Rf flows through the gain adjustment resistor Rs and the resistor Rd on an LED current sensing resistor line, the voltage at the inverting input terminal increases, and the error amplifier OP automatically starts control when the voltage at the inverting input terminal coincides with a voltage at the non-inverting input terminal. Thus, in order to shorten a time required to start LED-lighting, a current loop of Cf→Rf→Rs→Rd needs to be controlled.

To control the current loop, the LED driving device of the first embodiment is provided with the short circuit configured to make the inverting input terminal of the error amplifier OP grounded for a predetermined period of time after the activation.

Figure 12:
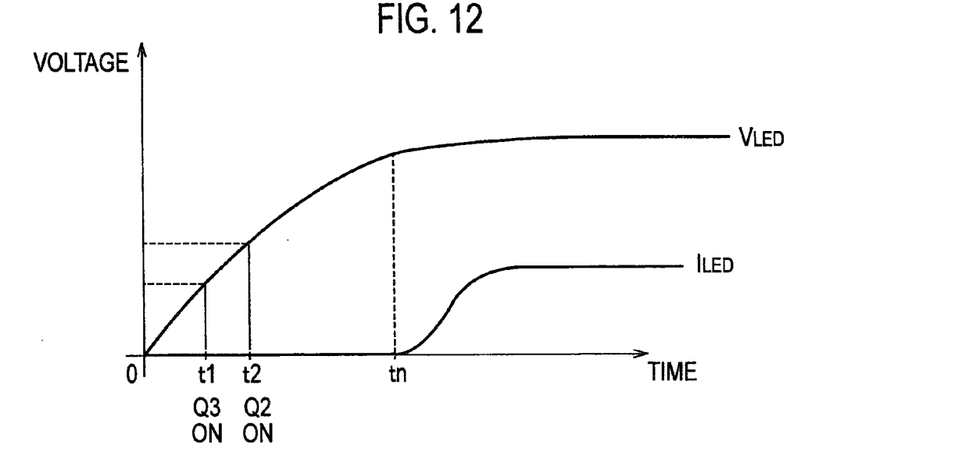

Next, with reference to FIGS. 3 and 12, a description is given of operation of the short circuit constituted by the MOSFET Q3, the MOSFET Q2, and the resistors R10 to R13.

First, when the AC power supply AC is turned on, an AC voltage of the AC power supply AC is rectified by the rectifying circuit DB, and a voltage is generated at the secondary winding W2 of the transformer TR. This voltage is transformed into a DC voltage by the diode D3 and the capacitor C7.

The DC voltage is divided between the resistor R10 and the resistor R11, and the divided voltage is applied to the gate of the MOSFET Q3. The DC voltage is also divided between the resistor R12 and the resistor R13, and the divided voltage is applied to the gate of the MOSFET Q2.

Since the resistance values of the resistor R10, the resistor R11, and the resistor R13 are set to be equal while the resistance value of the resistor R12 is set to be $\alpha$ times that of the resistor R10 ($\alpha$>1), the gate voltage of the MOSFET Q3 is larger than that of the MOSFET Q2. Hence, the MOSFET Q3 is turned on before the MOSFET Q2 is (time t1 in FIG. 12).

Thereby, the inverting input terminal of the error amplifier OP is short-circuited and grounded. In other words, the inverting input terminal of the error amplifier OP becomes 0 V, so that the output voltage of the capacitor C1 becomes H level.

Then, when the voltage at the capacitor C7 increases and a voltage obtained by dividing this voltage at the capacitor C7 between the resistor R12 and the resistor R13 exceeds a gate threshold of the MOSFET Q2 (e.g., 2 V), the MOSFET Q2 is turned on (time t2 in FIG. 12). Then, the gate of the MOSFET Q3 is grounded, and therefore the MOSFET Q3 is turned off. Thereby, the MOSFET Q3 is on during a period from time t1 to time t2 (which corresponds to a predetermined period of time of the present invention). While the MOSFET Q3 is on, the inverting input terminal of the error amplifier OP is 0 V. Thus, the output voltage of the error amplifier OP maintains the H level state. This allows the output voltage of the capacitor C1 to rise rapidly, so that a time required to start LED-lighting can be shortened.

Figure 9:
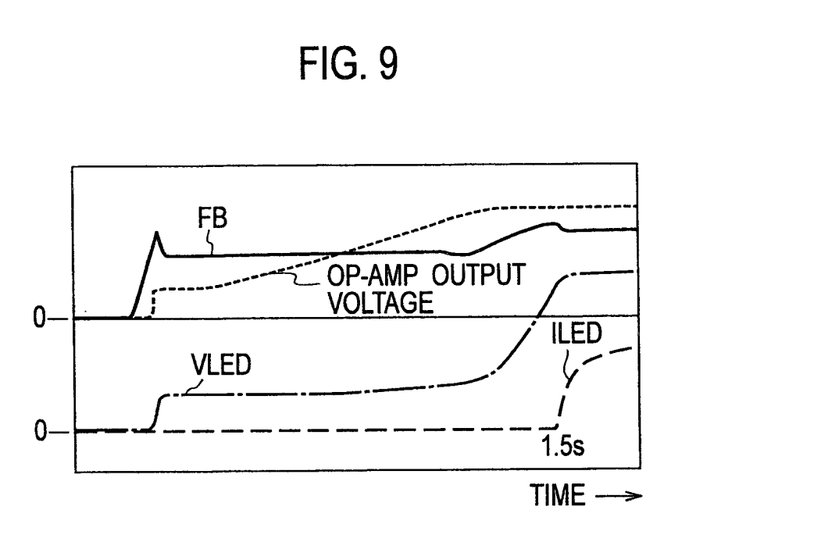
FIG. 9 is a diagram showing a time required to start LED-lighting in the conventional LED driving device having no MOSFET Q3 which short-circuits the inverting input terminal of the error amplifier.
Figure 10:
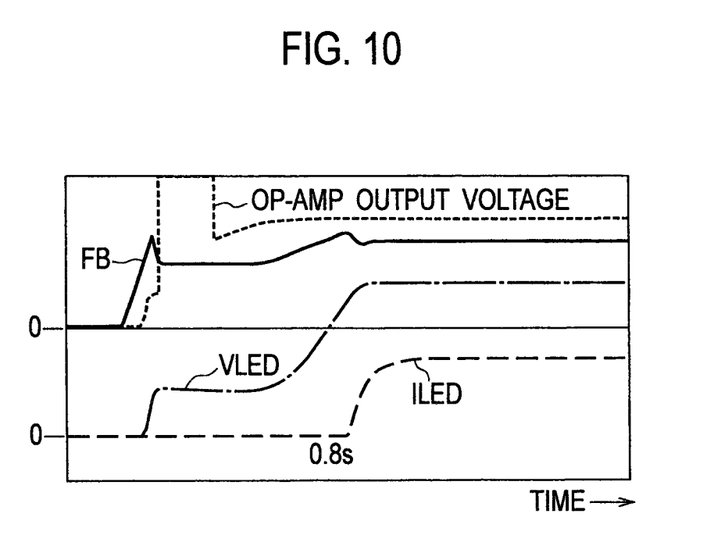
FIG. 10 is a diagram showing a time required to start LED-lighting of the LED driving device according to the first embodiment having the MOSFET Q3 which short-circuits the inverting input terminal of the error amplifier.

FIG. 9 shows a time required to start LED-lighting in a conventional LED driving deice with no MOSFET Q3. FIG. 10 shows a time required to start LED-lighting of the LED driving device according to the first embodiment having the MOSFET Q3 which short-circuits the inverting input terminal of the error amplifier. In FIGS. 9 and 10, FB denotes a voltage at the FB terminal, OP-AMP OUTPUT VOLTAGE denotes an output voltage of the error amplifier OP, VLED denotes a voltage at the LED elements LED1 to LEDn, and ILED denotes a current flowing through the LED elements LED1 to LEDn.

In the conventional circuit shown in FIG. 9, control is performed with the inverting input terminal of the error amplifier OP coinciding with the reference voltage, the output voltage of the error amplifier OP gradually increases, and it can be seen that it takes 1.5 seconds for the LED elements to start lighting up. In FIG. 10 showing the first embodiment, the output voltage of the error amplifier OP rapidly rises, and it takes 0.8 second for the LED elements to start lighting up. Thus, the time required to start LED-lighting can be shortened to less than one second.

Figure 11:
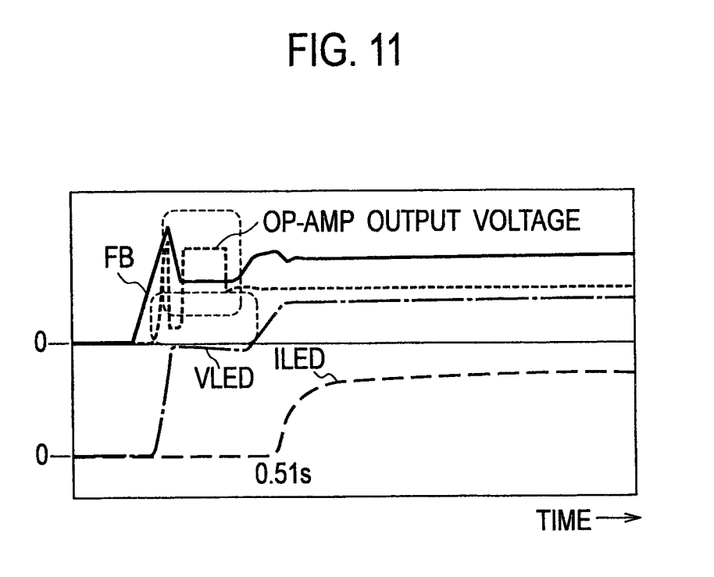
FIG. 11 is a diagram showing a time required to start LED-lighting of the LED driving device according to the first embodiment having the MOSFET Q3 which short-circuits the inverting input terminal of the error amplifier and a MOSFET Q2, the gate of which receives a voltage of a large voltage dividing ratio.

FIG. 11 shows a time required to start LED-lighting of the LED driving device according to the first embodiment having the MOSFET Q3 and the MOSFET Q2, the gate of which receives a voltage of a large voltage dividing ratio $\alpha$ ($\alpha$>1). The voltage dividing ratio $\alpha$ is a ratio between the resistance value of the resistor R12 and the resistance value of the resistor R10. A large voltage dividing radio $\alpha$ elongates the ON duration of the MOSFET Q3. Thus, the time required to start LED-lighting becomes 0.51 second as shown in FIG. 11, achieving a further reduction.

Note that, as shown in FIG. 12, the ON duration of the MOSFET Q3 (which corresponds to the predetermined period of time of the present invention) may be any period as long as it ends before an output targeted for error detection of the error amplifier OP (voltage at the inverting input terminal) reaches a predetermined value (rated voltage VLED of the LED elements, e.g., 30 V).

In this way, according to the LED driving device and the LED lighting apparatus according to the first embodiment, the short circuit constituted by the MOSFET Q2, the MOSFET Q3, and the resistors R10 to R13 makes the inverting input terminal of the error amplifier OP grounded for a predetermined period of time after the activation of the LED driving device. Thus, erroneous control of the error amplifier OP can be prevented, drastically shortening the time required to start LED-lighting.

Since the operation timings of the MOSFET Q3 are not dependent on the soft start circuit on the primary side, but based on the voltage at the capacitor C7 which is based on the rising slope of the voltage at the secondary side. Thus, a largest effect can be obtained when the brightness control level is set to the minimum level, and no adverse effect is obtained when a load current is large.

Second Embodiment

Figure 13:
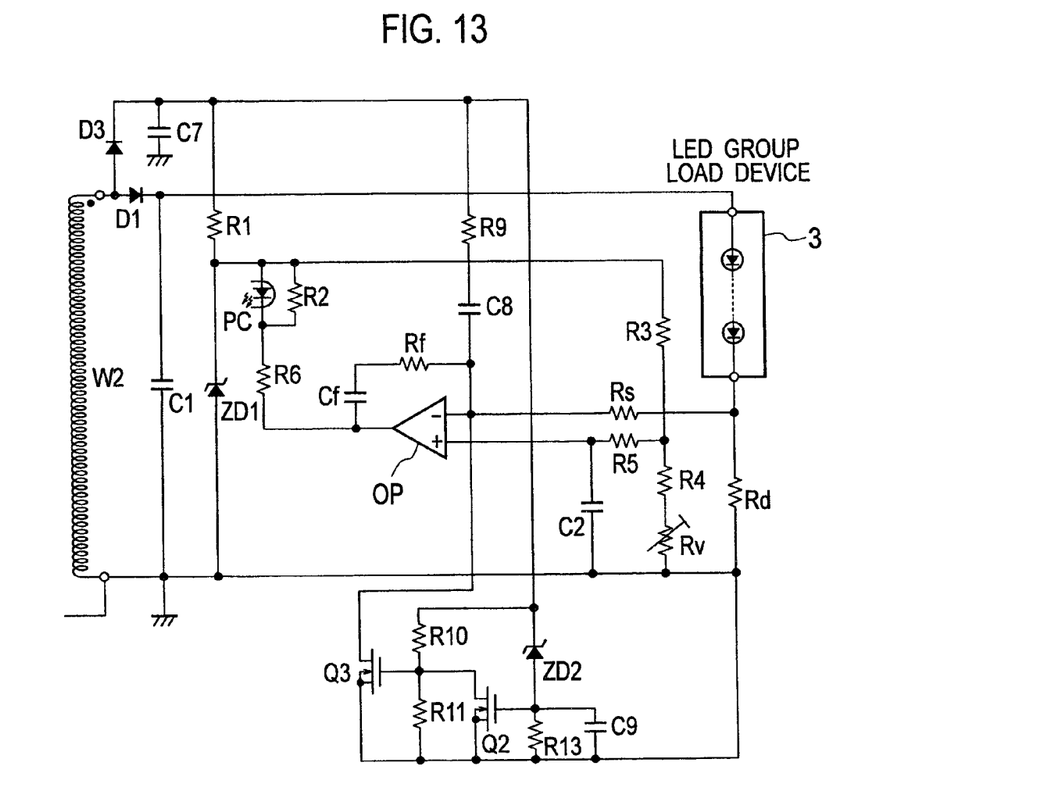
FIG. 13 is a circuit diagram showing a configuration of an LED driving device according to a second embodiment of the present invention.

FIG. 13 is a circuit diagram showing the configuration of an LED driving device according to a second embodiment of the present invention. The LED driving device shown in FIG. 13 is characterized in having a zener diode ZD2 and a capacitor C9 in place of the resistor R12 in the LED driving device shown in FIG. 3.

A cathode of the zener diode ZD2 is connected to one end of the capacitor C7, the cathode of the diode D3, and one end of the resistor R9, and an anode of the zener diode ZD2 is connected to the gate of the MOSFET Q2, one end of the resistor R13, and one end of the capacitor C9. The capacitor C9 is connected between both ends of the resistor R13.

After the MOSFET Q3 is turned on, a voltage at the capacitor C7 further increases, and the zener diode ZD2 breaks down. Then, the MOSFET Q2 is turned on, and the MOSFET Q3 is turned off.

In this way, the LED driving device of the second embodiment also offers similar advantageous effects to those offered by the LED driving device of the first embodiment.

The present invention can provide an LED driving device, an LED lighting apparatus, and an error amplification circuit capable of shortening the time required to start LED-lighting, since a short circuit makes an inverting input terminal of an error amplifier grounded for a predetermined period of time after the activation.

It should be noted that the present invention is not limited to the LED driving device and the LED lighting apparatus according to the first embodiment described above. In the LED driving device and the LED lighting apparatus according to the first embodiment described above, a DC voltage is generated using the AC power supply and the rectifying circuit DB, and this DC voltage is transformed into another DC voltage. However, the present invention may be applied, for example, to an LED driving device and an LED lighting apparatus in which a DC input voltage of a DC power supply is transformed into a desired DC input voltage and supplied to LED loads.

What is claimed is:

1. An LED driving device that transforms AC input power into desired DC output power and supplies the DC output power to an LED load, the LED driving device comprising:
    a switching element configured to be subjected to on-off control;
    an LED current sensor serially connected to the LED load and configured to detect a current flowing through the LED load;
    an error amplification circuit configured to amplify an error voltage between a reference voltage and a voltage which is based on the current detected by the LED current sensor; and
    a control circuit configured to control the DC output power so that the DC output power becomes a predetermined value, by performing the on-off control on the switching element based on the error voltage amplified by the error amplification circuit, wherein
    the error amplification circuit includes
        an error amplifier,
        a phase compensation circuit being connected between an inverting input terminal and an output terminal of the error amplifier and having a serial circuit of a phase compensation capacitor and a phase compensation resistor,
        a gain adjustment resistor serially connected at one end to the serial circuit and connected at the other end to the LED current sensor, and
        a short circuit configured to make the inverting input terminal of the error amplifier grounded for a predetermined period of time after activation.

2. The LED driving device according to claim 1, wherein the predetermined period of time is a period which ends before an output targeted for error detection by the error amplifier reaches a predetermined value.

3. An LED lighting apparatus comprising the LED driving device according to claim 2.

4. An LED lighting apparatus comprising the LED driving device according to claim 1.

* * * * *